(12) United States Patent
Kim et al.

(10) Patent No.: US 8,213,884 B2
(45) Date of Patent: Jul. 3, 2012

(54) BASEBAND-DERIVED RF DIGITAL PREDISTORTION

(75) Inventors: Wan Jong Kim, Coquitlam (CA); Shawn Patrick Stapleton, Burnaby (CA)

(73) Assignee: Dali System Co. Ltd., George Town, Grand Cayman ( * ) Notice: Subject to any disclaimer, the term of this patent is extended or adjusted under 35 U.S.C. 154(b) by 426 days.

(21) Appl. No.: 12/330,451

(22) Filed: Dec. 8, 2008

(65) Prior Publication Data

US 2009/0146736 A1  Jun. 11, 2009

Related U.S. Application Data

(60) Provisional application No. 61/012,416, filed on Dec. 7, 2007.

(51) Int. Cl.
*H04B 1/04* (2006.01)
(52) U.S. Cl. .................................................. 455/114.3
(58) Field of Classification Search ............... 455/114.1, 455/114.2, 114.3
See application file for complete search history.

(56) References Cited

U.S. PATENT DOCUMENTS

| | | |
|---|---|---|
| 4,638,248 A | 1/1987 | Schweickert |
| 4,700,151 A | 10/1987 | Nagata |
| 4,929,906 A | 5/1990 | Voyce et al. |
| 5,049,832 A | 9/1991 | Cavers |
| 5,121,412 A | 6/1992 | Borth |
| 5,396,190 A | 3/1995 | Murata |
| 5,486,789 A | 1/1996 | Palandech et al. |
| 5,579,342 A | 11/1996 | Crozier |
| 5,675,287 A | 10/1997 | Baker et al. |
| 5,678,198 A | 10/1997 | Lemson |
| 5,732,333 A | 3/1998 | Cox et al. |
| 5,757,229 A | 5/1998 | Mitzlaff |
| 5,786,728 A | 7/1998 | Alinikula |
| 5,936,464 A | 8/1999 | Grondahl |
| 5,937,011 A | 8/1999 | Carney et al. |
| 5,949,283 A | 9/1999 | Proctor et al. |
| 5,959,499 A | 9/1999 | Khan et al. |
| 5,963,549 A | 10/1999 | Perkins et al. |
| 6,054,896 A | 4/2000 | Wright et al. |
| 6,055,418 A | 4/2000 | Harris et al. |
| 6,091,941 A | 7/2000 | Moriyama et al. |
| 6,240,144 B1 | 5/2001 | Ha |
| 6,242,979 B1 | 6/2001 | Li |
| 6,246,286 B1 | 6/2001 | Persson |
| 6,246,865 B1 | 6/2001 | Lee |
| 6,275,685 B1 | 8/2001 | Wessel et al. |
| 6,301,579 B1 | 10/2001 | Becker |
| 6,400,774 B1 | 6/2002 | Matsuoka et al. |
| 6,424,225 B1 | 7/2002 | Choi et al. |
| 6,512,417 B2 | 1/2003 | Booth et al. |
| 6,552,634 B1 | 4/2003 | Raab |
| 6,625,429 B1 | 9/2003 | Yamashita |
| 6,639,050 B1 | 10/2003 | Kieliszewski |
| 6,677,870 B2 | 1/2004 | Im et al. |
| 6,697,436 B1 | 2/2004 | Wright et al. |
| 6,703,897 B2 | 3/2004 | O'Flaherty et al. |
| 6,741,663 B1 | 5/2004 | Tapio et al. |

(Continued)

*Primary Examiner* — Jeffrey Zweizig

(74) *Attorney, Agent, or Firm* — Kilpatrick Townsend & Stockton LLP

(57) ABSTRACT

A baseband-derived RF predistortion system using a lookup table having coefficients extracted at baseband and then applied at RF by means of a vector modulator. The architecture combines the narrowband advantage of envelope predistortion with the accuracy of baseband predistortion, and including compensation for memory effects. A polynomial-based alternative is also described.

13 Claims, 3 Drawing Sheets

U.S. PATENT DOCUMENTS

| | | |
|---|---|---|
| 6,747,649 B1 | 6/2004 | Sanz-Pastor et al. |
| 6,751,447 B1 | 6/2004 | Jin et al. |
| 6,963,242 B2 | 11/2005 | White et al. |
| 6,983,025 B2 | 1/2006 | Schell |
| 6,985,704 B2 | 1/2006 | Yang et al. |
| 7,035,345 B2 | 4/2006 | Jeckeln et al. |
| 7,042,287 B2 | 5/2006 | Robinson |
| 7,061,314 B2 | 6/2006 | Kwon et al. |
| 7,064,606 B2 | 6/2006 | Louis |
| 7,079,818 B2 | 7/2006 | Khorram |
| 7,102,442 B2 | 9/2006 | Anderson |
| 7,103,329 B1 | 9/2006 | Thon |
| 7,104,310 B2 | 9/2006 | Hunter |
| 7,106,806 B1 | 9/2006 | Kenington |
| 7,109,792 B2 | 9/2006 | Leffel |
| 7,109,998 B2 | 9/2006 | Smith |
| 7,151,913 B2 | 12/2006 | Ahmed |
| 7,158,765 B2 | 1/2007 | Blair et al. |
| 7,193,472 B2 | 3/2007 | Gotou et al. |
| 7,248,642 B1 | 7/2007 | Vella-Coleiro |
| 7,321,635 B2 | 1/2008 | Ocenasek et al. |
| 7,321,636 B2 | 1/2008 | Harel et al. |
| 7,372,918 B2 * | 5/2008 | Muller et al. .................. 375/296 |
| 7,469,491 B2 | 12/2008 | McCallister et al. |
| 7,831,221 B2 * | 11/2010 | Leffel et al. ................ 455/114.3 |
| RE42,287 E | 4/2011 | Apodaca et al. |
| 2002/0034260 A1 | 3/2002 | Kim |
| 2002/0044014 A1 | 4/2002 | Wright et al. |
| 2002/0080891 A1 | 6/2002 | Ahn et al. |
| 2002/0101937 A1 | 8/2002 | Antonio et al. |
| 2002/0101938 A1 | 8/2002 | Horaguchi et al. |
| 2002/0179830 A1 | 12/2002 | Pearson et al. |
| 2002/0187761 A1 | 12/2002 | Im et al. |
| 2002/0193085 A1 | 12/2002 | Mathe et al. |
| 2003/0095608 A1 | 5/2003 | Duperray |
| 2003/0179829 A1 | 9/2003 | Pinckley et al. |
| 2003/0179830 A1 | 9/2003 | Eidson et al. |
| 2003/0207680 A1 | 11/2003 | Yang et al. |
| 2004/0017859 A1 | 1/2004 | Sills et al. |
| 2004/0240585 A1 | 12/2004 | Bishop et al. |
| 2005/0079834 A1 | 4/2005 | Maniwa et al. |
| 2005/0159117 A1 | 7/2005 | Bausov et al. |
| 2005/0262498 A1 | 11/2005 | Ferguson et al. |
| 2006/0012426 A1 | 1/2006 | Nezami |
| 2006/0270366 A1 | 11/2006 | Rozenblit et al. |
| 2007/0075780 A1 | 4/2007 | Krvavac et al. |
| 2007/0171234 A1 | 7/2007 | Crawfis et al. |
| 2007/0241812 A1 | 10/2007 | Yang et al. |

* cited by examiner

Figure 1
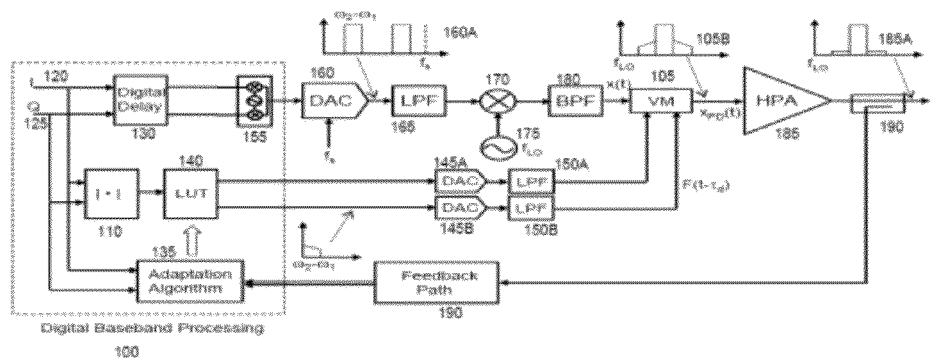
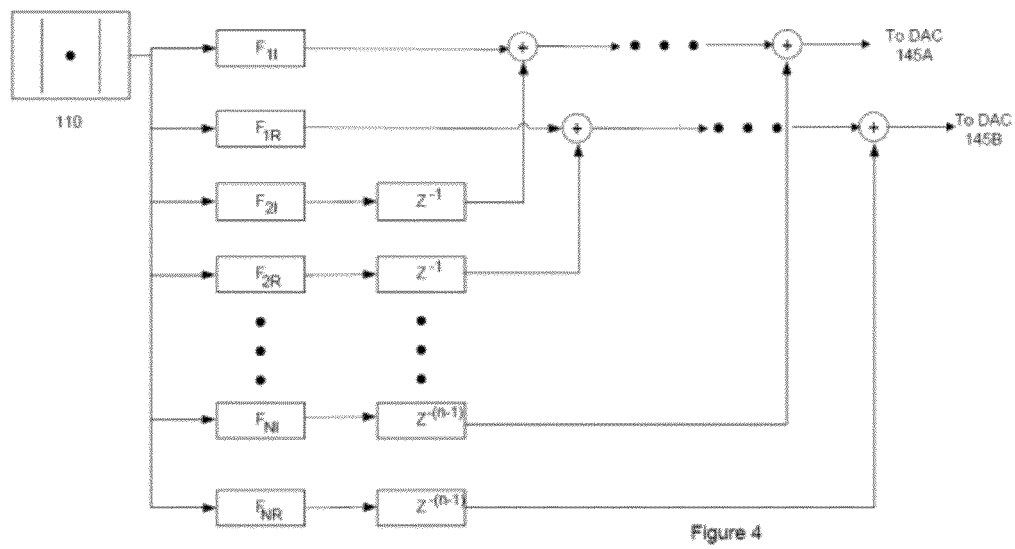
Figure 4

BASEBAND-DERIVED RF DIGITAL PREDISTORTION

RELATED APPLICATION

This application claims the benefit of U.S. provisional patent application Ser. No. 61/012,416, filed Dec. 7, 2007, which is incorporated in full herein by reference, including attachments, for all purposes.

FIELD OF THE INVENTION

The present invention relates to power amplifiers for wireless communications systems, and more particularly relates to predistortion methods for linearizing the output of such power amplifiers.

BACKGROUND

Reliable mobile, or wireless, communication systems rely on clean and consistent transmission from base-stations under widely and rapidly changing conditions. Therefore, the radio frequency (RF) power amplifiers (PA) found in the base stations of such wireless communication systems have typically been the most critical and costly component. This is derived from the stringent requirements on spectrum and power efficiency of these transmitters, even though they are driven by wideband and highly varying signals. To meet the demanding specifications for these amplifiers, a number of linearization techniques have been implemented. One such linearization technique, called digital baseband predistortion, has been successfully implemented using digital signal processors. However, digital baseband predistortion has a disadvantage in that it requires the entire transmit path to be several times wider than the signal bandwidth due to the predistorted input. Therefore, this wideband transmit path demands a fast digital-to-analog converter (DAC) and wideband filters. Moreover, as the bandwidth of the input signal gets wider, the bandwidth requirement of the baseband predistortion system gets much wider. In contrast, the main advantage of RF envelope digital predistortion is that the transmit path doesn't need to be wideband. But RF envelope digital predistortion has the disadvantage that it requires additional components, such as an envelope detector and large RF delay lines, that create inaccuracy and loss, as well as increased cost and complexity. There has therefore been a need for a predistortion system that provides the desired precision without unnecessary cost and complexity.

THE FIGURES

FIG. 1 illustrates in block diagram form an embodiment of the predistortion system of the present invention.

FIG. 4 illustrates an alternative embodiment to the lookup table shown in FIG. 1, using a polynomial calculation.

SUMMARY

Figure 2:
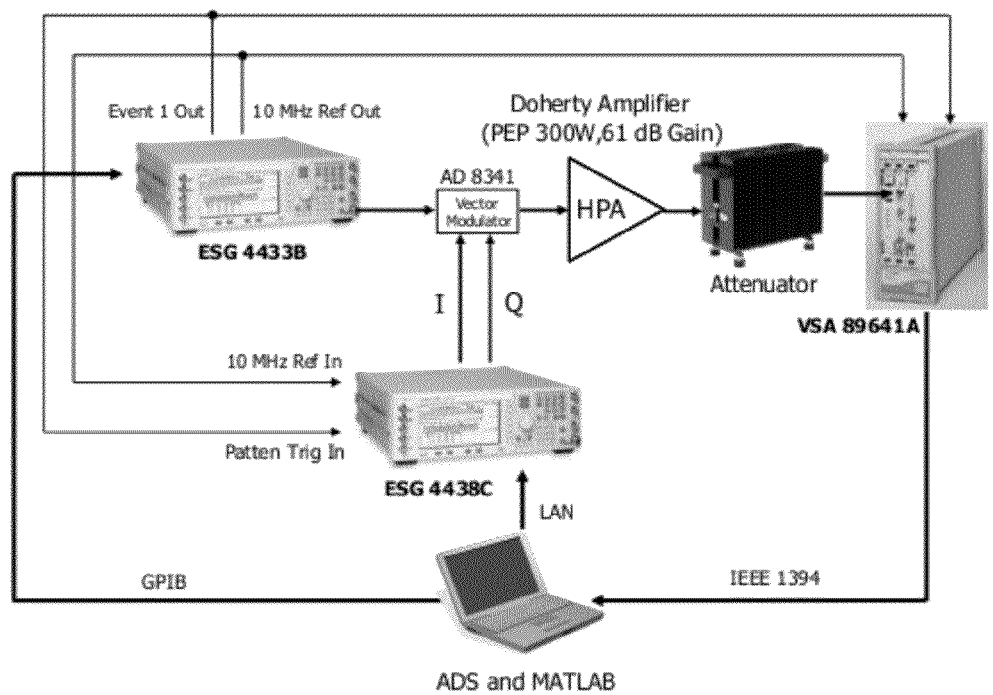
FIG. 2 illustrates in block diagram form a test bench for establishing and verifying the operation of the system of the present invention.

The present invention comprises a new architecture for a predistortion system that substantially removes the wideband requirements and potential distortions caused by the additional components typically required in the prior art. Experimental results demonstrate that the proposed architecture achieves a reduction of adjacent channel power ratio (ACPR) comparable to conventional baseband predistortion. The proposed architecture is suitable for the applications which require wide bandwidth (i.e., >100 MHz).

DETAILED DESCRIPTION OF THE INVENTION

A block diagram of an embodiment of the proposed system is shown in FIG. 1. A predistortion function, F, is derived at baseband as shown in the block 100 labeled Digital Baseband Processing, but applied to the output at RF. A vector modulator 105, also indicated as VM, is employed to generate the predistorted signal based on the predistortion function. A magnitude calculation block 110 indexes an input signal in order to determine the proper correction coefficients at each instant either from a lookup table or a polynomial calculation. A digital delay component is able to compensate for the delay difference, $\tau_d$, between the predistorting path and the main transmit path, including memory effects. This delay mismatch between two paths should be compensated using delay calibration.

More particularly, an input signal is converted into I and Q components 120 and 125 in a conventional manner (and therefore not shown). The I and Q components are provided to a digital delay 130, and also provided to the magnitude calculation block 110 as well as an adaptation algorithm block 135.

In an embodiment as shown in FIG. 1, the magnitude calculation block and the adaptation algorithm block both provide inputs to a look-up table 140, which has stored therein a database of correction coefficients appropriate to the range of operation of the system. As noted above, the LUT 140 supplies the correction factor appropriate to each value of the input to a pair of DAC's 145A-B. The outputs of the DAC's 145A-B are filtered in a pair of low pass filters 150A-B, the outputs of which are provided to the vector modulator 105.

In at least some embodiments, the LUT values are initially obtained via a calibration routine, whereby the output signal from the power amplifier is measured and the LUT coefficients are estimated so as to compensate for any nonlinear distortion created by the power amplifier. In such an embodiment, the LUT coefficients can be stored in the memory of either an FPGA or a DSP, and can be populated with a microprocessor or digital signal processor. In addition, the LUT coefficients can be updated by, as just one example, feeding the output of the power amplifier back to the baseband signal processor, where it is compared with the input signal, in response to which the lookup table value is updated. The feedback block shown in FIG. 1 can also be implemented by, for example, down-converting the output of the power amplifier to baseband. The baseband signal can then be compared with the input signal and the resulting error will be used to update the LUT coefficients. As just one alternative, the output signal from the power amplifier can be spectrally monitored, and the the feedback signal will monitor the out-of-band distortion using a downconverter, bandpass filter and power detector. The output of the power detector can then be used to adjust the LUT values or, if a polynomial approach is used, to adjust the polynomial coefficients.

Referring to FIG. 4, an implementation of the invention using a polynomial approach can be better appreciated. Instead of using a lookup table as in FIG. 1, the output of the magnitude calculation block 110 is provided to a series of polynomials $F_{1I}$, $F_{1R}$, $F_{2I}$, $F_{2R}$, $F_{NI}$, $F_{NR}$ (each calculated in either the DSP or FPGA performing other processing), and then summed as shown. The result of the summation is then provided to the DAC's 145A-B, just as with the output of the lookup table in FIG. 1. The remainder of the design is the same, and is therefore not repeated in FIG. 4. The polynomials can be expressed as $$F_1\{z\} = \alpha_{11} + \alpha_{12}z + \alpha_{13}z^2 + \ldots + \alpha_{1N}z^{N-1}$$

and $$F_2\{z\} = \alpha_{11} + \alpha_{12}z + \alpha_{13}z^2 + \ldots + \alpha_{1N}z^{N-1}$$

As noted above, the polynomial coefficients are updated in the same manner as the updates to the lookup table described in connection with FIG. 1. It will be appreciated by those skilled in the art that the present invention, whether implemented using a polynomial approach, or the lookup table approach of FIG. 1, is able to compensate for memory effects in the power amplifier, thus providing substantially improved linearization over the prior art.

Referring still to FIG. 1, the output of the digital delay 130 is supplied to a quadrature modulator 155, the output of which is supplied to a DAC 160. The output of the DAC 160, which takes the form shown in the graph 160A, is provided to a low pass filter 165, where it is modulated in mixer 170 with the signal $f_{Io}$ as indicated at 175, and then passed through bandpass filter 180. The result is provided to the vector modulator 105, which also receives the correction signals, including delay compensation, from the LPF's 150A-B. The vector modulator output forms the envelope indicated in the graph 105A, and is provided to the power amplifier 185, the output of which is represented by the graph 185A. The output is also sampled at 190, and the sample is fed back along feedback path 195 as another input to the adaptation algorithm logic 135, to permit the output signal to be monitored to ensure, among other things, that the values in the look-up table are updated if appropriate.

In some embodiments, the DAC 160 will preferably have at least twice bandwidth of the signal to be converted.

Delay mismatch: To see delay mismatch effects with respect to performance of the system, suppose the RF input, x(t), consists of two tones with a tone spacing $(\omega_2-\omega_1)$. The predistortion function, F, with delay mismatch, $\tau_d$, can be described as $$F(t-\tau_d) = a_1 + a_3|x_e(t-\tau_d)|^2 = a_1 + \tfrac{1}{2}a_3 + \tfrac{1}{2}a_3\cos[(\omega_2-\omega_1)t + \omega_1\tau_d] \quad (1)$$

where $x_e(t)$ is the envelope of the input signal, a's are the complex coefficients of the polynomials, and $\tau_d$ is the delay mismatch. It can be seen from (1) that the predistortion function requires the same bandwidth of the frequency spacing in order to compensate up to third order inter-modulation distortions (IMD). The predistorted input RF signal, $x_{PD}(t)$, then can be expressed as $$x_{PD}(t) = x(t)F(t-\tau_d) \quad (2)$$

After substituting (1) into (2), expending, and arranging it, it can be simply formulated as $$x_{PD}(t) = b_1 S + b_3 S_{u\_IMD3} \angle -(\omega_2-\omega_1)\tau_d + b_3 S_{L\_IMD3} \angle (\omega_2-\omega_1)\tau_d \quad (3)$$

where b's are complex coefficients and S, $S_{U\_IMD3}$, and $S_{L\_IMD3}$ denotes two tone RF input signals, third order upper IMD, and lower IMD components, respectively. From (3), depending on $\tau_d$, the phase of the upper IMD components is decreased by $(\omega_2-\omega_1)\tau_d$ and the phase of the lower IMD parts increases by the same amount.

Experimental Results: A single carrier wideband code division multiplexing access (WCDMA) signal with 10 dB peak-to-average power ratio (PAPR) is used in the test bench shown in FIG. 2 for the proposed structure of the predistortion system. The test bench consists of two electronic signal generators (Agilent E4433B and E4438C), a vector modulator (Analog Devices AD8341), a Doherty power amplifier with 300 WATTS peak envelope power (PEP) and 61 dB gain, a vector signal analyzer (Agilent VSA89641A), and a personal computer with MATLAB and advanced design system (ADS). The baseband in-phase (I) and quadrature (Q) outputs on the rear panel of E4438C are connected into AD8341. The first source (E4433B) is considered as a master and its 10 MHz reference output is used by the slave source (E4438C) as a clock reference (10 MHz input). The RF input signal x(t) and the baseband derived signal or function F are synchronized based on the following procedures. A marker is placed at the beginning of the input signal file x(t) in the master source, so that a pulse is sent on the EVENT1 output every time that this marker is met. The EVENT1 output is connected to the pattern trigger input of the slave. In order to estimate delay difference, coarse delay calibration was performed based on delay measurements between the main path for the RF input signal and the baseband path for the predistortion function. The predistortion algorithm applied here is based on memoryless fifth order polynomial using indirect learning.

Figure 3:
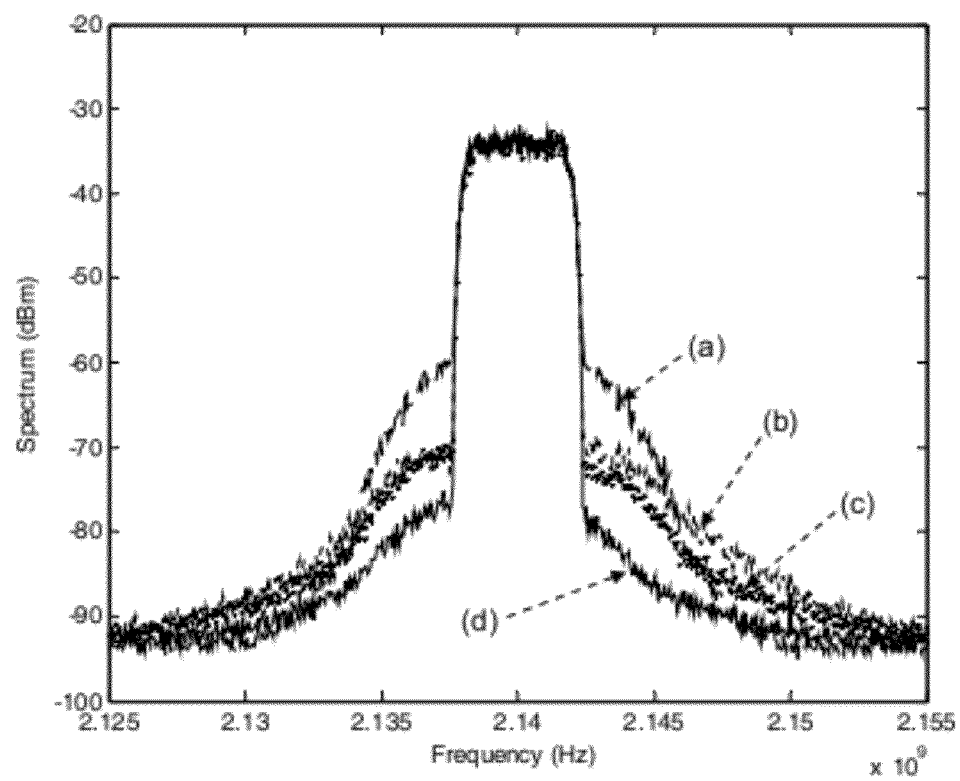
FIG. 3 illustrates in graphical form the measured spectra for the delay dependence of the system wherein (a) represents the output of a power amplifier without predistortion (b) represents the output of a power amplifier with one sample advanced (c) represents the output of a power amplifier with one sample delayed (d) represents the output of a power amplifier with coarse delay match.

FIG. 3 shows the measurements results for the digital predistortion system of the present invention. The system reduces the distortions around 15 dB as seen from curves (a) and (d) in FIG. 3, and the performances with respect to delay dependence are represented in (b) and (c). With one sample (26 nsec) advanced and one sample delayed intentionally to investigate effects on delay, the system performances are degraded by around 4 dB to 10 dB. This verifies that delay mismatch is detrimental to the proposed system performance like RF envelope digital predistortion. However, using the system of the present invention, the delay can be substantially perfectly matched using digital delay, unlike RF envelope digital predistortion which utilizes analog RF delay lines.

Having fully described an embodiment of the invention and various alternatives, those skilled in the art will recognize, given the teachings herein, that numerous alternatives and equivalents exist which do not depart from the invention. It is therefore intended that the invention not be limited by the foregoing description, but only by the appended claims

We claim:

1. A wideband predistortion system for use with RF power amplifiers comprising:
   a baseband input for receiving a baseband signal,
   an RF output for providing a signal to an RF power amplifier,
   logic for deriving a predistortion function from the baseband signal and generating a predistortion signal, wherein the logic comprises a polynomial calculation, and
   a vector modulator responsive to the predistortion function and connected to the RF output for applying the predistortion signal to the RF output.

2. The wideband predistortion system of claim 1 wherein the vector modulator comprises a variable attenuator and a variable phase shifter.

3. The wideband predistortion system of claim 1 wherein the baseband signal is at an Intermediate Frequency.

4. The wideband predistortion system of claim 1 wherein the baseband signal is output using a digital to analog converter for a quadrature component and for an in-phase component.

5. The wideband predistortion system of claim 1 wherein the baseband signal is frequency translated to a RF frequency using a quadrature modulator.

6. The wideband predistortion system of claim 1 further comprising a digital delay block.

7. The wideband predistortion system of claim 6 wherein the digital delay block comprises an equalizer.

8. A wideband predistortion system for use with RF power amplifiers, the system comprising:
   a baseband input for receiving a baseband signal, wherein the baseband signal is frequency translated to an RF frequency using a quadrature modulator;
   an RF output for providing a signal to an RF power amplifier;
   logic for deriving a predistortion function from the baseband signal and generating a predistortion signal, wherein the logic comprises a lookup table; and
   a vector modulator responsive to the predistortion function and connected to the RF output for applying the predistortion signal to the RF output.

9. The wideband predistortion system of claim 8 wherein the vector modulator comprises a variable attenuator and a variable phase shifter.

10. The wideband predistortion system of claim 8 wherein the baseband signal is at an Intermediate Frequency.

11. The wideband predistortion system of claim 8 wherein the baseband signal is output using a digital to analog converter for a quadrature component and for an in-phase component.

12. The wideband predistortion system of claim 8 further comprising a digital delay block.

13. The wideband predistortion system of claim 12 wherein the digital delay block comprises an equalizer.

* * * * *

UNITED STATES PATENT AND TRADEMARK OFFICE
CERTIFICATE OF CORRECTION

| | | |
|---|---|---|
| PATENT NO. | : 8,213,884 B2 | Page 1 of 1 |
| APPLICATION NO. | : 12/330451 | |
| DATED | : July 3, 2012 | |
| INVENTOR(S) | : Wan Jong Kim and Shawn Patrick Stapleton | |

It is certified that error appears in the above-identified patent and that said Letters Patent is hereby corrected as shown below:

On the Title Page, Item (73) should read,

(73) Assignee: Dali Systems Co. Ltd., George Town, Grand Cayman

Signed and Sealed this
Tenth Day of September, 2013

Teresa Stanek Rea
*Acting Director of the United States Patent and Trademark Office*